United States Patent
Kang et al.

(10) Patent No.: US 10,495,685 B2
(45) Date of Patent: Dec. 3, 2019

(54) MULTI-SOURCE SIGNAL GENERATOR AND OPERATING METHOD THEREOF

(71) Applicant: ELECTRONICS AND TELECOMMUNICATIONS RESEARCH INSTITUTE, Daejeon (KR)

(72) Inventors: Dongwoo Kang, Daejeon (KR); Bon Tae Koo, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 175 days.

(21) Appl. No.: 15/716,612

(22) Filed: Sep. 27, 2017

(65) Prior Publication Data

US 2018/0156861 A1 Jun. 7, 2018

(30) Foreign Application Priority Data

Dec. 5, 2016 (KR) .................. 10-2016-0164673
Jun. 22, 2017 (KR) .................. 10-2017-0079385

(51) Int. Cl.
| | |
|---|---|
| G01R 31/28 | (2006.01) |
| H03B 5/12 | (2006.01) |
| H01L 31/08 | (2006.01) |
| H01L 31/028 | (2006.01) |
| H04B 1/00 | (2006.01) |
| H04L 27/156 | (2006.01) |

(52) U.S. Cl.
CPC ..... *G01R 31/2841* (2013.01); *G01R 31/2822* (2013.01); *H01L 31/028* (2013.01); *H01L 31/085* (2013.01); *H03B 5/1228* (2013.01); *H04B 1/00* (2013.01); *H04L 27/156* (2013.01); *H03B 5/1212* (2013.01); *H03B 2200/0084* (2013.01)

(58) Field of Classification Search
CPC .................................................. G01R 31/2841
USPC ........................................................... 331/74
See application file for complete search history.

(56) References Cited

U.S. PATENT DOCUMENTS

| | | | |
|---|---|---|---|
| 6,434,187 B1 * | 8/2002 | Beard | H04B 1/403 |
| | | | 332/128 |
| 7,684,023 B2 | 3/2010 | Kang et al. | |
| 8,895,913 B2 | 11/2014 | Tekin et al. | |

(Continued)

FOREIGN PATENT DOCUMENTS

| | | |
|---|---|---|
| KR | 10-0848317 B1 | 7/2008 |
| KR | 10-2014-0084866 A | 7/2014 |

*Primary Examiner* — Joseph Chang
(74) *Attorney, Agent, or Firm* — Rabin & Berdo, P.C.

(57) ABSTRACT

Provided is a multi-source signal generator including a voltage-controlled oscillator configured to generate a first source signal having a first frequency to deliver the first source signal to a first output port, a Single Pole Double Throw (SPDT) switch configured to select the first source signal or an external source signal, a first power amplifier configured to amplify power of the first source signal selected by the SPDT switch, and a multi-source converting unit configured to multiply a frequency of the amplified first source signal or divide power of the amplified first source signal to generate multi-source signals, wherein the frequency of the first source signal and frequencies of the multi-source signals are included in a millimeter wave band or sub-terahertz (THz) band.

14 Claims, 7 Drawing Sheets

(56) References Cited

U.S. PATENT DOCUMENTS

| | | |
|---|---|---|
| 9,130,082 B2 | 9/2015 | Park et al. |
| 9,385,651 B2 | 7/2016 | Zong et al. |
| 2007/0075589 A1* | 4/2007 | Inoue .................. H01P 1/15 307/115 |
| 2010/0225407 A1* | 9/2010 | Goyal ................. H03B 19/00 331/117 FE |
| 2011/0122932 A1* | 5/2011 | Lovberg ............. H04L 27/2039 375/219 |
| 2012/0142283 A1* | 6/2012 | Taya .................. H03J 1/0041 455/76 |
| 2015/0072630 A1* | 3/2015 | Matsumura ............... H03L 7/24 455/113 |

* cited by examiner

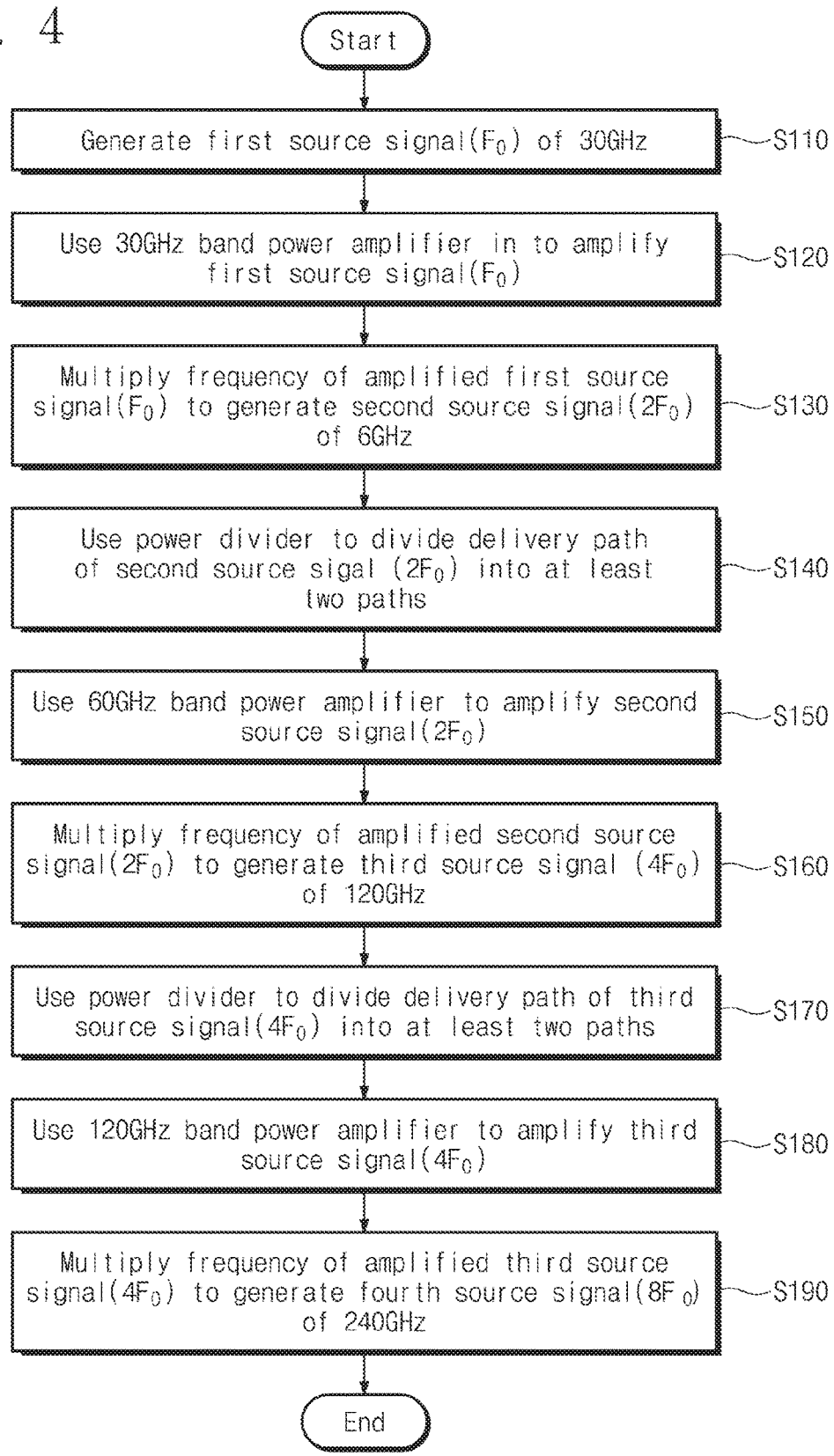

MULTI-SOURCE SIGNAL GENERATOR AND OPERATING METHOD THEREOF

CROSS-REFERENCE TO RELATED APPLICATIONS

This U.S. non-provisional patent application claims priority under 35 U.S.C. § 119 of Korean Patent Application Nos. 10-2016-0164673, filed on Dec. 5, 2016, and 10-2017-0079385, filed on Jun. 22, 2017, the entire contents of which are hereby incorporated by reference.

BACKGROUND

The present disclosure herein relates to an electronic device, and more particularly, to a multi-source signal generator and an operating method thereof.

Nowadays, a 5th-generation mobile communication (5G) standard for ultra-high speed communications is being developed using millimeter wave band frequencies. For South Korea and the US, 28 GHz band frequencies are allowed and being developed as 5G band. The international telecommunication union (ITU) discusses 32 GHz band and 40 GHz to 43 GHz band as frequency bands for 5G and many countries develop and demonstrate 5G technologies in different frequency bands from each other. In addition, for short range communication such as Wireless Local Area Network (WLAN), ultra-high speed communication technology is being developed using 60 GHz Industrial Scientific Medical (ISM) band. As a technical standard using 60 GHz band frequencies, 'IEEE 802.11ay' is being standardized which extends the transmission speed and distance from 'IEEE 802.11 ad'. For 'IEEE 802.11ay', 4 channels are bonded to achieve the maximum transmission speed of 42.24 Gbps. Accordingly, 'IEEE 802.11ay' standard is recently being emerged as a proper solution to be applied to augmented reality (AR) or virtual reality (VR) technology.

Not only the communication technology, but fields such as imaging, radar, and spectrum use 100 GHz frequency or higher. A US company 'TeraSense' implements a signal source in 100 GHz to 140 GHz band using 'IMPATT Diode' and develops to sale imaging cameras, scanners, and signal sources. In addition, besides 60 GHz band, 120 GHz and 240 GHz band frequencies are designated as the ISM band, and thus utility thereof is very high.

Currently, a commercial use signal source chip of 10 GHz or lower for 'IEEE 802.11a/b/g/n/ac' standards may be easily obtained. However, at a frequency of 30 GHz band or higher, it is hard to obtain a commercial use cheap signal source chip. A signal source in a frequency band of 30 GHz band or higher mostly configures a system according to a client's request by purchasing expensive equipment or using III-V devices. Due to the above-described issues, the development cost is high in an initial development stage and the development period is long. Therefore, development of a cheap complementary metal-oxide-semiconductor (CMOS) signal source is urgently required which supports a frequency band having a highest utility in a millimeter wave band or sub-terahertz (THz) band (30 GHz to 240 GHz).

SUMMARY

The present disclosure provides a multi-source signal generator implemented with a stable CMOS device, which may support 5G, IEEE 802.11ad/ay, and ISM bands having a highest utility in millimeter wave and sub-THz bands, and an operating method thereof.

An embodiment of the inventive concept provides a multi-source signal generator including: a voltage-controlled oscillator configured to generate a first source signal having a first frequency to deliver the first source signal to a first output port; a Single Pole Double Throw (SPDT) switch configured to select the first source signal or an external source signal; a first power amplifier configured to amplify power of the first source signal selected by the SPDT switch; and a multi-source converting unit configured to multiply a frequency of the amplified first source signal or divide power of the amplified first source signal to generate multi-source signals, wherein the frequency of the first source signal and frequencies of the multi-source signals are included in a millimeter wave band or sub-terahertz (THz) band.

In an embodiment of the inventive concept, an operating method of a multi-source signal generator includes: generating a first source signal; amplifying power of the first source signal; and multiplying gradationally a frequency of the first source signal to generate multi-source signals, wherein the first source signal and the multi-source signals have frequencies in a millimeter wave band or sub-THz band and the multi-source signal generator is provided with a single chip manufactured through a complementary metal-oxide-semiconductor process.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 4 is a flowchart briefly showing an operation of the multi-source signal generator of an embodiment of the present inventive concept;

DETAILED DESCRIPTION

Hereinafter embodiments of the present inventive concept will be described in detail with reference to the accompanying drawings. In the following description, specific details such as detailed components and structures are provided to assist overall understanding of embodiments of the present disclosure. Therefore, various changes or modifications can be made by those of ordinary skill in the art in the specific details without departing from technical spirit and scope of the present disclosure. Furthermore, descriptions of well-known functions and structures will be omitted for clarity and conciseness. Terms to be described hereinafter are defined in consideration of functions of the present inventive concept and can be differed according to users, intentions of the users, or customers. The definitions of the terms can be determined based on details described in the specification.

Figure 1:
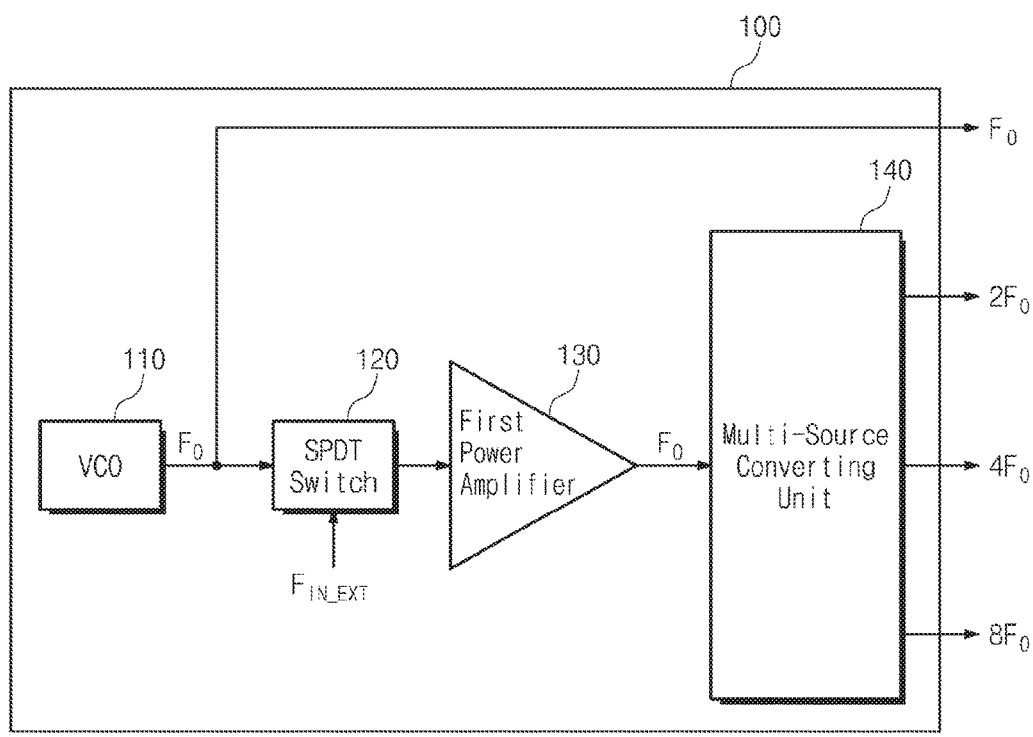
FIG. 1 is a block diagram exemplarily showing a multi-source signal generator according to an embodiment of the present inventive concept.

FIG. 1 is a block diagram exemplarily showing a multi-source signal generator according to an embodiment of the present inventive concept. Referring to FIG. 1, a multi-source signal generator 100 includes a voltage-controlled oscillator (VCO) 110, a Single Pole Double Throw (SPDT) switch 120, a first power amplifier 130, and a multi-source converting unit 140.

The VCO 110 is an oscillator of which an oscillation frequency varies according to a control voltage. The VCO 110 may output a first source signal $F_O$ in a millimeter wave band. The VCO 110 may be implemented with, for example, a differential VCO. An oscillation signal output from a positive output port (+Port) of the VCO 110, which is implemented with a differential VCO, may be output as the first source signal $F_O$ of the multi-source signal generator 100. On the contrary, an oscillation signal output from a negative output port (−Port) of the VCO 110 may be delivered to the SPDT switch 120.

The VCO 110 may have an oscillation characteristic for generating a millimeter band frequency oscillation signal of 27 GHz to 33 GHz. In order to be implemented with a semiconductor device, the VCO 110 may include a varactor. According to a control voltage provided to the varactor, a frequency of the oscillation signal may be adjusted using a characteristic that capacitance C of the varactor is variable according to the control voltage provided to the varactor. In addition, it may be well understood that the VCO 110 may further include means for locking the frequency of the output oscillation signal.

The SPDT switch 120 is a switch for selecting any one of an output of the VCO 110 and a transmitting signal $F_{IN\_EXT}$ provided from the outside. The SPDT switch 120 may select, by a preset selection value or a user, any one of the output of the VCO 110 and the transmitting signal $F_{IN\_EXT}$ provided from the outside as a source signal for generating multi-source signals.

The first power amplifier 130 amplifies power of the signal selected by the SPDT switch 120. The first source signal $F_O$ selected by the SPDT switch will be divided into various paths and processed by the multi-source converting unit 140. Accordingly, it is necessary to sufficiently amplify the reduced power of the first source signal $F_O$ and provide the same to the multi-source converting unit 140. The first power amplifier 130 should be designed to have a characteristic to amplify a frequency band (e.g. 30 GHz) of the first source signal $F_O$. Furthermore, the first power amplifier 130 is required to have output characteristics of about 5 to 15 dBm in order to drive a frequency multiplier (not shown) of the multi-source converting unit 140.

The multi-source converting unit 140 may covert the frequency of the first source signal $F_O$ into various frequency multiples to generate a plurality of source signals $2F_O$, $4F_O$, and $8F_O$. The multi-source converting unit 140 doubles the frequency of the first source signal $F_O$ to output the same as a second source signal $2F_O$. The multi-source converting unit 140 doubles the frequency of the second source signal $2F_O$ to output the same as a third source signal $4F_O$. The multi-source converting unit 140 doubles the frequency of the third source signal $4F_O$ to output as a fourth source signal $8F_O$. Here, the plurality of source signals $F_O$, $2F_O$, $4F_O$, and $8F_O$ may be provided as source signals having frequencies of millimeter wave band or sub-THz band (30 GHz to 240 GHz).

The VCO 110, the SPDT switch 120, the first power amplifier 130, and the multi-source converting unit 140 configuring the multi-source signal generator 100 may be manufactured through a complementary metal-oxide-semiconductor (CMOS) process. Accordingly, the multi-source signal generator 100, which may provide the plurality of source signals in the millimeter wave band and sub-THz band, may also be implemented with a single semiconductor chip. The multi-source signal generator 100 may be used in various systems such as 5G, WPAN, and ISM band communication.

Figure 2:
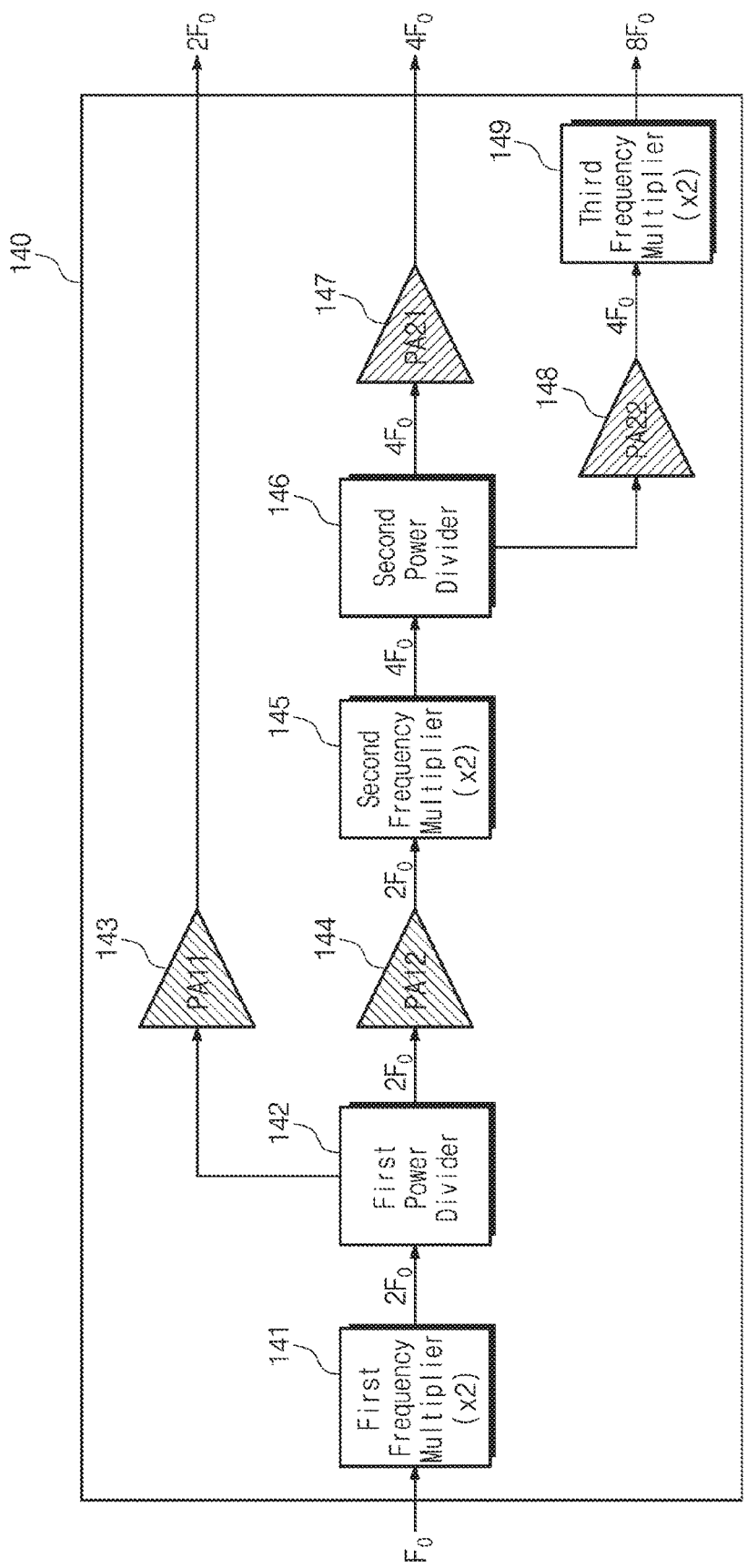
FIG. 2 is a block diagram showing in detail a configuration of a multi-source converting unit of FIG. 1.

FIG. 2 is a block diagram showing in detail a configuration of the multi-source converting unit of FIG. 1. Referring to FIG. 2, the multi-source converting unit 140 processes the first source signal $F_O$ to generate the source signals $2F_O$, $4F_O$, and $8F_O$ in the millimeter wave band and sub-THz band (30 GHz to 240 GHz). To this end, the multi-source converting unit 140 includes a plurality of frequency multipliers 142, 145 and 149, a plurality of power dividers 142 and 146, and a plurality of power amplifiers 143, 144, 147, and 148.

The first frequency multiplier 141 may double the frequency of the first source signal $F_O$. The first frequency multiplier 141 processes the first source signal $F_O$, which is a source signal, with a nonlinear device to generate a plurality of harmonics. In addition, the first frequency multiplier 141 will selectively output the second source signal $2F_O$ having a double frequency from among the plurality of harmonics. The first frequency multiplier 141 may be easily implemented with a CMOS processed semiconductor device.

The first power divider 142 divides the second source signal $2F_O$ into two delivery paths. In other words, the power divider 142 divides the second source signal $2F_O$ output from the first frequency multiplier 141 into two signals having an identical phase and waveform. However, the first power divider 142 divides power of the input signal and outputs the divided powers. The first power divider 142 may be implemented with a passive device such as a Wilkinson divider having wideband characteristics, or implemented in an active divider type.

The second power amplifier 143 amplifies power of any one of second source signals $2F_O$ output from the first power divider 142. The second power amplifier 143 amplifies the power of the second source signal $2F_O$, which is reduced by the first power divider 142, to deliver the same to an output port of the multi-source signal generator 100. The second power amplifier 143 may be configured of a driver amplifier capable of amplifying the power to an optimal level according to an amplitude of the second source signal $2F_O$ delivered to the output port.

The third power amplifier 144 amplifies power of the other one of the second source signals $2F_O$ output from the first power divider 142. The power of the second source signal $2F_O$ is significantly reduced by the first frequency multiplier 141 and the first power divider 142. Accordingly, in order to amplify the reduced power of the second source signal $2F_O$, the third power amplifier 144 should be designed to be suitable for amplifying a signal in a band of the second source signal $2F_O$. In particular, the third power amplifier 144 should be designed to have an output of 5 to 15 dBm in order to deliver the second source signal $2F_O$ to the second frequency multiplier 145.

The second frequency multiplier 145 doubles the frequency of the second source signal $2F_O$ of which power is amplified by the third power amplifier 144. The second frequency multiplier 145 processes the second source signal $2F_O$, which is a source signal, with a nonlinear device to generate a plurality of harmonics. In addition, the second frequency multiplier 145 will selectively output the third source signal $4F_O$ corresponding to the double frequency of the second source signal $2F_O$ from among the plurality of harmonics.

The second power divider 146 divides the third source signal $4F_O$ into two delivery paths. In other words, the second power divider 146 divides the third source signal $4F_O$ output from the second frequency multiplier 145 into two signals having an identical phase and waveform. However, the second power divider 146 divides only power of the input signal and output the divided powers. The second power divider 146 may be implemented with a passive device such as a Wilkinson divider having wideband characteristics, or also implemented in an active divider type.

The fourth power amplifier 147 amplifies power of any one of third source signals $4F_O$ output from the second power divider 146. The fourth power amplifier 147 amplifies the power of the third source signal $4F_O$, which is reduced by the first power divider 146, to deliver the amplified signal to an output port of the multi-source signal generator 100. It may be well understood that the fourth power amplifier 147 may be configured of a driver amplifier capable of amplifying the power to an optimal level according to an amplitude of the third source signal $4F_O$ delivered to the output port. In other words, the fourth power amplifier 147 may include a driver amplifier for amplifying the amplitude of the signal, when the amplitude of the third source signal $4F_O$ is small.

The fifth power amplifier 148 amplifies power of the other one of the third source signals $4F_O$ output from the second power divider 146. In order to amplify the reduced power of the third source signal $4F_O$, the fifth power amplifier 148 should be designed to be suitable for amplifying a signal in a band of the third source signal $4F_O$. In particular, the fifth power amplifier 148 should be designed to have an output of 5 to 15 dBm in order to deliver the third source signal $4F_O$ to the third frequency multiplier 149.

The third frequency multiplier 149 doubles the frequency of the third source signal $4F_O$ of which power is amplified by the fifth power amplifier 148. The fourth source signal $8F_O$ generated by the third frequency multiplier 149 may be delivered to an output port of the multi-source signal generator 100.

Hereinbefore, a brief description has been provided about an exemplary configuration of the multi-source converting unit 140. All components included in the multi-source converting unit 140 may be easily manufactured through a CMOS process. Accordingly, the multi-source signal generator 100 according to an embodiment of the present invention may be implemented in a signal chip type which provides a plurality of stable source signals $F_O$, $2F_O$, $4F_O$, and $8F_O$. Here, the frequency of the first source signal $F_O$ may be, for example, 30 GHz. In this case, the multi-source signal generator 100 may be implemented with one semiconductor chip providing source signals of different frequencies used in the millimeter wave band and sub-THz band (30 GHz to 240 GHz).

Figure 3A:
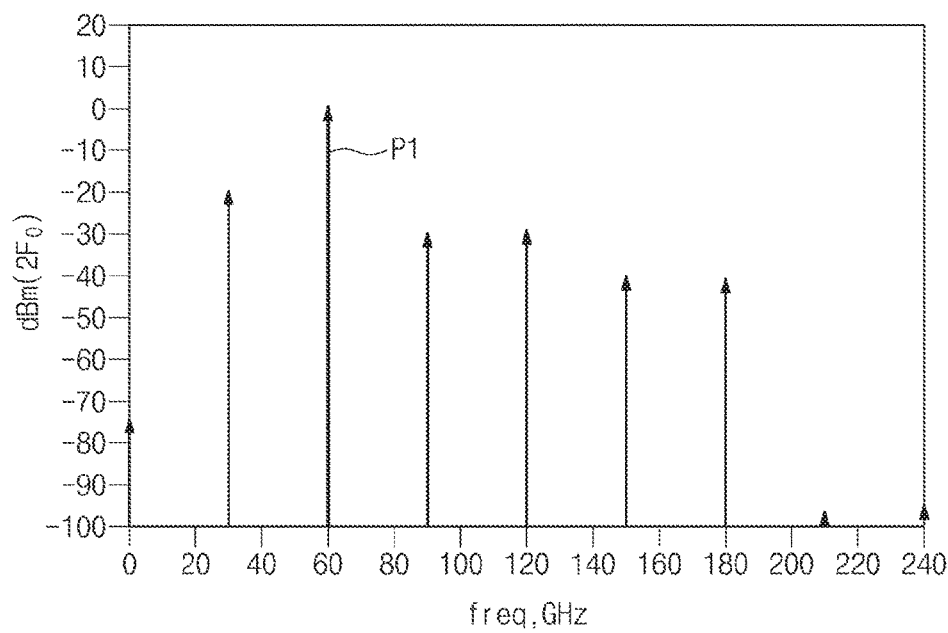
FIGS. 3A, 3B, 3C are drawings showing spectrums of second to fourth sources $2F_O$, $4F_O$ and $8F_O$ output from respective output ports of the multi-source converting unit of FIG. 2.
Figure 3B:
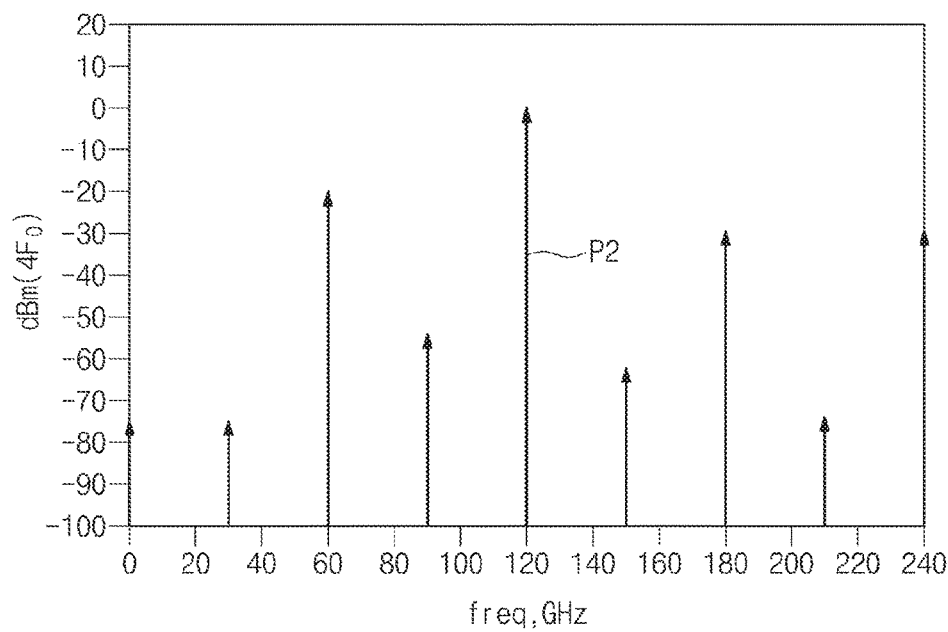
Figure 3C:
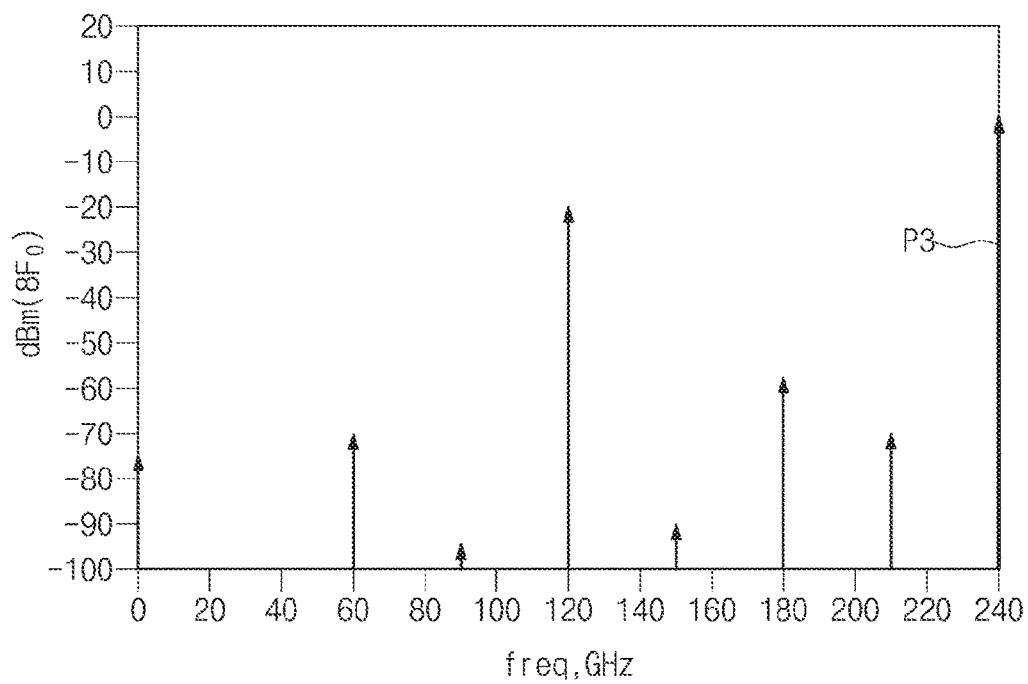

FIGS. 3A, 3B, 3C are drawings showing spectrums of second to fourth sources $2F_O$, $4F_O$ and $8F_O$ output from respective output ports of the multi-source converting unit of FIG. 2. Here, a case will be exemplarily described which provides, as 30 GHz, the frequency of the first source signal $F_O$ provided to the multi-source converting unit 140 as a source.

FIG. 3A shows a spectrum of the second source signal $2F_O$. The second source signal $2F_O$ is one of harmonics corresponding to integer multiple frequencies of the first source signal $F_O$, which are generated by nonlinear devices of the first frequency multiplier 141. Substantially, a harmonic P1 corresponding to a double frequency (e.g. 60 GHz) of the first source signal $F_O$ is selected and amplified by the second power amplifier 143.

FIG. 3B shows a spectrum of the third source signal $4F_O$. A plurality of harmonics may be generated by the second frequency multiplier 145. In addition, a harmonic P2 corresponding to the third source signal $4F_O$ may be selected from the harmonics and output by the second frequency multiplier 145. Thereafter, the third source signal $4F_O$ will be amplified and delivered to the output port by the fourth power amplifier 147.

FIG. 3C shows a spectrum of the fourth source signal $8F_O$. Harmonics of the third source signal $4F_O$ may be generated by the third frequency multiplier 149. In addition, a harmonic P3 corresponding to the fourth source signal $8F_O$ may be selected from the harmonics and output by the third frequency multiplier 149. Thereafter, the fourth source signal $8F_O$ will be delivered to the output port.

Hereinbefore, the spectrums of the second to fourth source signals $2F_O$, $4F_O$, and $8F_O$ of the embodiment of the present inventive concept are described. The multi-source converting unit 140 of the embodiment of the present inventive concept, which may be manufactured in a CMOS process, may generate a plurality of source signals having integer multiple frequencies of the first source signal $F_O$. Accordingly, the multi-source signal generator 100 of the embodiment of the inventive concept may be easily implemented with a cheap single semiconductor chip.

FIG. 4 is a flowchart briefly showing an operation of the multi-source signal generator of an embodiment of the present inventive concept. Referring to FIG. 4, the multi-source signal generator 100 may perform multiplication on one source signal generated by one VCO 110 to output a plurality of source signals.

In operation S110, the first source signal $F_O$ is generated by the VCO 110. The first source signal $F_O$ is assumed to have a frequency of 30 GHz. The first source signal $F_O$ generated by the VCO 110 is divided into two signal paths and the divided signals are delivered therethrough. One signal path is connected to the output port of the multi-source signal generator 100 and the other signal path is connected to the SPDT switch 120. The first source signal $F_O$ generated by the VCO 110 is output to the output port of the multi-source signal generator 100 and at the substantially same time, is provided as a source signal for generating the multi-source signals.

In operation S120, the power of the first source signal $F_O$ is amplified by the first power amplifier 130. The first source signal $F_O$ may be processed using components such as a frequency multiplier or power divider which consumes power. Accordingly, it is necessary to amplify the power of the first source signal $F_O$ such that the first source signal $F_O$ has sufficient power, before power consumption occurs. When the first source signal $F_O$ is processed by the frequency multiplier 141, the first power amplifier 130 is required to have an output characteristic of about 5 to 15 dBm.

In operation S130, the first source signal having a frequency of 30 GHz is converted to the second source signal $2F_O$ having a frequency of 60 GHz by the first frequency multiplier 141.

In operation S140, the second source signal $2F_O$ having a frequency of 60 GHz is divided into at least two signal paths. For example, one of the divided second source signals $2F_O$ by the first power divider 142 is delivered to the output port of the multi-source signal generator 100. Before being delivered to the output port, the second source signal $2F_O$ may be amplified by the second power amplifier 143 or the driver amplifier and then delivered to the output port.

In operation S150, the other one of the divided second source signals $2F_O$ by the first power divider 142 is delivered to the third power amplifier 144. Here, the second power amplifier 143 and the third power amplifier 144 should be designed to have gain and band characteristics for amplifying a 60 GHz band signal. The second power amplifier 143 and the third power amplifier 144 are required to have an output characteristic of about 5 to 15 dBm.

In operation S160, the second source signal having a frequency of 60 GHz is converted to the third source signal $4F_O$ having a frequency of 120 GHz by the second frequency multiplier 145.

In operation S170, a delivery path of the third source signal $4F_O$ having a frequency of 120 GHz is divided into at least two signal paths. In other words, one of the divided third source signals $4F_O$ by the second power divider 146 is delivered to the output port of the multi-source signal generator 100. Before being delivered to the output port, the third source signal $4F_O$ may be amplified by the fourth power amplifier 147 or the driver amplifier and then delivered to the output port.

In operation S180, the other one of the divided third source signals 2F0 by the second power divider 146 is delivered to the fifth power amplifier 148. Here, the fourth power amplifier 147 and the fifth power amplifier 148 have gain and band characteristics for amplifying a 120 GHz band signal. In addition, the fourth power amplifier 147 and the fifth power amplifier 148 are required to have an output characteristic of about 5 to 15 dBm.

In operation S190, the third source signal $4F_O$ having a frequency of 120 GHz is converted to the fourth source signal $8F_O$ having a frequency of 240 GHz by the third frequency multiplier 149. The fourth source signal $8F_O$ of 240 GHz frequency will be delivered to the output port of the multi-source signal generator 100.

Hereinbefore, a brief description has been provided about a method for generating the first source signal $F_O$ of 30 GHz frequency, multiplying and amplifying the generated first source signal $F_O$ to generate the plurality of source signals $2F_O$, $4F_O$ and $8F_O$. Here, the frequency of the first source signal $F_O$ is described as 30 GHz, but it would be well understood that the embodiment of the present inventive concept is not limited thereto. The frequency of the first source signal $F_O$ may be set to various values through the VCO 110. In addition, frequencies of the plurality of source signals $2F_O$, $4F_O$ and $8F_O$ may also be provided as integer multiples of the frequency of the first source signal $F_O$.

Hereinbefore, an example has been described in which the first source signal $F_O$ is provided through the VCO 110. However, it will be well understood that, for more stable provision of the source signals, the first source signal $F_O$, which is provided from the outside through the SPDT switch 120, may be used as a source for generating the plurality of source signals $2F_O$, $4F_O$, and $8F_O$.

Figure 5:
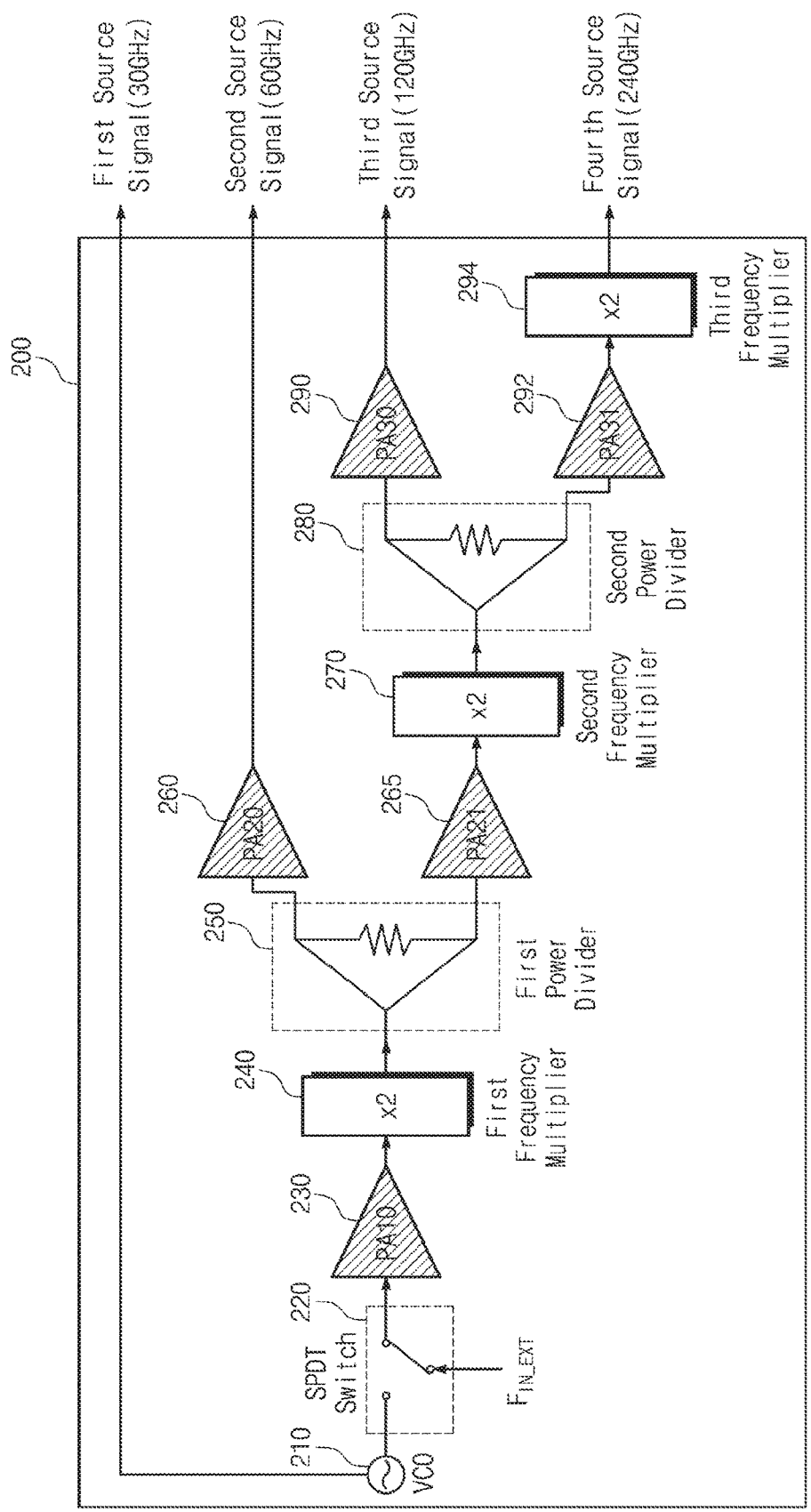
FIG. 5 shows in detail the multi-source signal generator implemented with a single chip according to an embodiment of the present inventive concept.

FIG. 5 shows in detail the multi-source signal generator 200 implemented with a single chip according to an embodiment of the present inventive concept. Referring to FIG. 5, first to fourth source signals may be provided by the multi-source signal generator 200 that is implemented with a signal chip. The multi-source signal generator 200 may include a VCO 210, an SPDT switch 220, power amplifiers 230, 260, 270, 290 and 292, frequency multipliers 240, 270 and 294, and power dividers 250 and 280.

The VCO 210 generates the first source signal of 30 GHz frequency. When the VCO 210 is driven by a differential VCO, an oscillation signal output from a positive output port (+Port) may be output as the first source signal of the multi-source signal generator 200. Furthermore, an oscillation signal output from a negative output port (−Port) of the VCO 100 may be delivered to the SPDT switch 220. Source signals of various frequencies used in a millimeter wave band may be generated through a control for the VCO 210.

The SPDT switch 220 is a switch for selecting any one of an output of the VCO 210 and an oscillation signal $F_{IN\_EXT}$ provided from the outside. The SPDT switch 220 may select, by a preset selection value or a user, any one of the output of the VCO 210 and the oscillation signal $F_{IN\_EXT}$ provided from the outside as a source signal for generating multi-source signals. A 30 GHz frequency signal of high purity may be received from the outside through the SPDT switch 220 and delivered to the first power amplifier 230 for generating the second to fourth signals.

Power of the first source signal in the 30 GHz band may be amplified by the first power amplifier 230. Attenuation of the first source signal, which occurs when frequency multiplication and power division are subsequently performed, may be compensated through the power amplification by the first power amplifier 230.

The first frequency multiplier 240 doubles a frequency of the first source signal to deliver the same to the first power divider 250. In other words, the first frequency multiplier 240 converts the first source signal of 30 GHz frequency to the second source signal of 60 GHz frequency.

The first power divider 250 divides the second source signal of 60 GHz frequency into two signal paths and delivers them thereto. One of the two divided signal paths is connected to an output port of the multi-source signal generator 200 via the second power amplifier 260. In addition, the other one of the two divided signal paths is connected to the third power amplifier 265 for generating the first and fourth source signals.

The second and third power amplifier 260 and 265 respectively amplify the divided second source signals of 60 GHz frequency. The second source signals of 60 GHz frequency divided into two signal paths have an identical phase and frequency, but the powers thereof are also dividedly reduced. Accordingly, the reduced powers of the second source signals on the two signal paths may be respectively amplified by the second and third power amplifiers 260 and 265 and delivered to the output port and the second frequency multiplier 270.

The second frequency multiplier 270 doubles the 60 GHz frequency of the second source signal. The second frequency multiplier 270 will convert the frequency of the second source signal to 120 GHz and output the 120 GHz frequency signal as a third source signal.

The second power divider 280 divides the third source signal of 120 GHz frequency into two signal paths and delivers them thereto. One of the two divided signal paths is connected to an output port of the multi-source signal generator 200 via the fourth power amplifier 290. In addition, the other one of the two divided signal paths is connected to the fifth power amplifier 292 for generating the fourth source signal.

The fourth and fifth power amplifier 290 and 292 respectively amplify powers of the divided third source signals of 120 GHz frequency. The divided third source signals of 120 GHz frequency on the two signal paths have an identical phase and frequency. However, the signal powers of the divided third source signals of 120 GHz frequency are reduced. Accordingly, the reduced powers of the third source signals may be respectively amplified by the fourth and fifth power amplifiers 290 and 292 and delivered to the output port and the third frequency multiplier 294.

The third frequency multiplier 294 doubles the frequency of the third source signal amplified by the fifth power amplifier 292. In addition, the fourth signal of 240 GHz frequency generated by the third frequency multiplier 294 is delivered to an output port of the multi-source signal generator 200.

Hereinbefore, a brief description has been provided about a structure of the multi-source signal generator 200 capable of being implemented with a single chip by the CMOS process. Here, it has been described that 4 source signals used as source signals in the millimeter wave band and the sub-THz band are provided from the multi-source signal generator 200, but the embodiment of the present inventive concept is not limited thereto. It would be well understood that many more source signals may be provided from the multi-source signal generator 200 using frequency multipliers and power dividers. In addition, a case has been exemplified where the frequency of the first source signal generated by the VCO 210 is 30 GHz, but the embodiment of the present inventive concept is not limited thereto.

Figure 6:
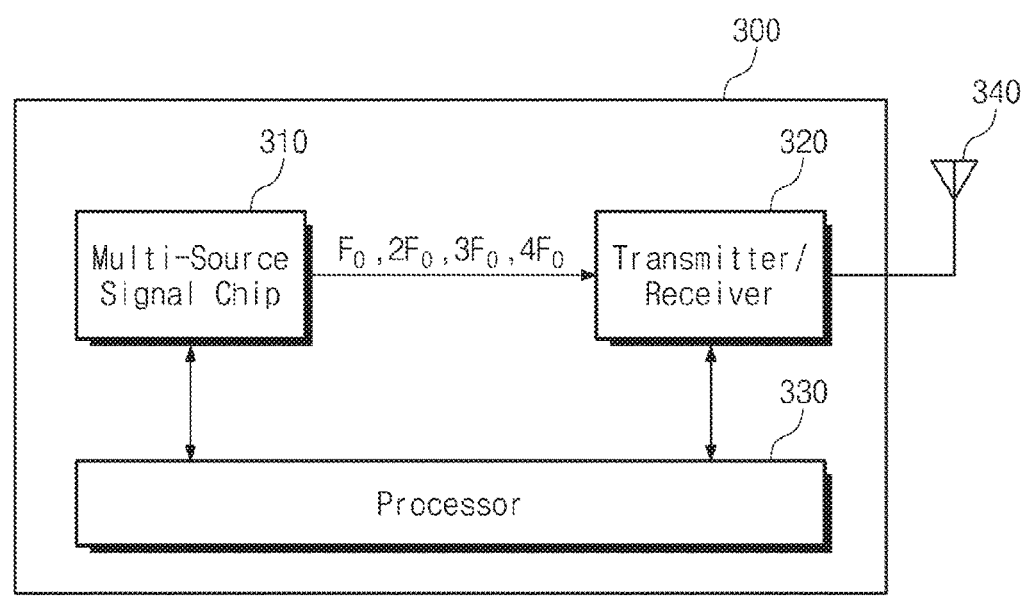
FIG. 6 is a block diagram exemplarily showing an electronic device including a multi-source signal chip according to an embodiment of the present inventive concept.

FIG. 6 is a block diagram exemplarily showing an electronic device including a multi-source signal chip according to an embodiment of the present inventive concept. Referring to FIG. 6, an electronic device 300 of an embodiment of the present inventive concept may include a multi-source signal chip 310, a transmitter/receiver 320, and a processor 330. The multi-source signal chip 310 may include the multi-source signal generator 100 or 200 of FIG. 1 or FIG. 5 manufactured through the CMOS semiconductor process.

The multi-source signal chip 310 may output a plurality of source signals having different frequencies. The multi-source signal chip 310 may generate the plurality of source signals useable as signal sources in the millimeter wave band and the sub-THz band. The multi-source signal chip 310 may provide the plurality of source signals $F_O$, $2F_O$, $4F_O$, and $8F_O$ having frequencies in the millimeter wave band and the sub-THz band (30 GHz to 240 GHz).

The transmitter/receiver 320 may modulate a voice signal or data signal to transmit the modulated signal through an antenna 340 using any one of the plurality of source signals $F_O$, $2F_O$, $4F_O$, and $8F_O$. Alternatively, the transmitter/receiver 320 may demodulate a signal received through the antenna 340 using any one of the plurality of source signals $F_O$, $2F_O$, $4F_O$, and $8F_O$. For example, the transmitter/receiver 320 may use, as a signal source, any one of the source signals $F_O$, $2F_O$, $4F_O$, and $8F_O$ for 5G, WPAN, and ISM communication.

The processor 330 processes a signal transmitted to or received from the transmitter/receiver 320, and converts the signal into a voice or data to process the voice or data.

The electronic device 300 may be a terminal or a base station for communication in the millimeter wave band or sub-THz band (30 GHz to 240 GHz). When the multi-source signal chip 310 of the present inventive concept is adopted, the electronic device 300 may be configurable in a low cost, since signal sources of various frequencies may be provided by a single chip.

According to a configuration of an embodiment of the present inventive concept, a plurality of source signals are generated by one chip. The plurality of source signals may support frequencies in a millimeter wave band and a sub-THz band (30 GHz to 240 GHz) to be used in various systems in 5G, WPAN, and ISM bands, etc. In particular, an existing signal source chip of the millimeter wave band and sub-THz band (30 GHz to 240 GHz) is expensive and provides only a single source signal. The multi-source signal generator of the embodiment of the present inventive concept may provide source signals in various bands at the substantially same time, and due to CMOS implementation, is cheap and has high utility.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A multi-source signal generator comprising:
a voltage-controlled oscillator (VCO) configured to generate a first source signal having a first frequency to deliver the first source signal to a first output port;
a Single Pole Double Throw (SPDT) switch configured to select either the first source signal or an external source signal for output to a first power amplifier;
a first power amplifier configured to amplify power of the first source signal selected by the SPDT switch; and
a multi-source converting unit configured to multiply a frequency of the amplified first source signal or divide power of the amplified first source signal to generate multi-source signals,
wherein the first frequency of the first source signal and frequencies of the multi-source signals are included in a millimeter wave band or sub-terahertz (THz) band.

2. The multi-source signal generator of claim 1, wherein the VCO, the SPDT switch, the first power amplifier, and the multi-source converting unit include at least one complementary metal-oxide-semiconductor (CMOS) device.

3. The multi-source signal generator of claim 1, wherein the first frequency is included in a band of about 27 GHz to 33 GHz.

4. The multi-source signal generator of claim 1, wherein the first source signal and the multi-source signals are provided as signal sources of at least one of a 5th generation mobile communication (5G) system, a Wireless Personal Area Network (WPAN) communication system, or an Industrial Scientific Medical (ISM) communication system.

5. A multi-source signal generator comprising:
a voltage-controlled oscillator (VCO) configured to generate a first source signal having a first frequency to deliver the first source signal to a first output port;
a Single Pole Double Throw (SPDT) switch configured to select the first source signal or an external source signal;
a first power amplifier configured to amplify power of the first source signal selected by the SPDT switch; and
a multi-source converting unit configured to multiply a frequency of the amplified first source signal or divide power of the amplified first source signal to generate multi-source signals,
wherein
the first frequency of the first source signal and frequencies of the multi-source signals are included in a millimeter wave band or sub-terahertz (THz) band, and
the multi-source converting unit comprises:
a first frequency multiplier configured to double the frequency of the amplified first source signal to convert the amplified first source signal to a second source signal, and to output the second source signal;

a second frequency multiplier configured to double a frequency of the second source signal to convert the second source signal to a third source signal, and to output the third source signal; and a third frequency multiplier configured to double a frequency of the third source signal to convert the third source signal to a fourth source signal, and to output the fourth source signal.

6. The multi-source signal generator of claim 5, wherein the multi-source converting unit further comprises:

a first power divider configured to divide a first signal path so as to deliver the second source signal output from the first frequency multiplier to a second output port and the second frequency multiplier; and a second power divider configured to divide a second signal path so as to deliver the third source signal output from the second frequency multiplier to a third output port and the third frequency multiplier.

7. The multi-source signal generator of claim 6, wherein the multi-source converting unit further comprises:

a second power amplifier configured to amplify power of the second source signal to be delivered to the second output port and deliver the amplified second source signal; and a third power amplifier configured to amplify power of the second source signal to be delivered to the second frequency multiplier.

8. The multi-source signal generator of claim 7, wherein the multi-source converting unit further comprises:

a fourth power amplifier configured to amplify power of the third source signal to be delivered to the third output port and deliver the amplified third source signal; and a fifth power amplifier configured to amplify power of the third source signal to be delivered to the third frequency multiplier.

9. The multi-source signal generator of claim 8, wherein the second power amplifier or the fourth power amplifier includes a driver amplifier.

10. The multi-source signal generator of claim 8, wherein each of the first power amplifier, the third power amplifier, and the fifth power amplifier has an output range of 5dBm to 15dBm.

11. An operating method of a multi-source signal generator, the method comprising:

generating a first source signal;

selecting, from the first source signal and an external source signal, the first source signal to be amplified, amplifying power of the first source signal;

multiplying gradationally a frequency of the first source signal to generate multi-source signals, and wherein the first source signal and the multi-source signals have frequencies in a millimeter wave band or sub-THz band and the multi-source signal generator is provided with a single chip including at least one complementary metal-oxide-semiconductor (CMOS) device.

12. The operating method of claim 11, wherein the frequency of the first source signal is included in a band of 27 GHz to 33 GHz.

13. The operating method of claim 11, wherein the generating of the multi-source signals comprises:

multiplying the frequency of the first source signal to generate a second source signal;

amplifying power of the second source signal;

multiplying a frequency of the second source signal of which power is amplified to generate a third source signal;

amplifying power of the third source signal; and multiplying a frequency of the third source signal of which power is amplified to generate a fourth source signal.

14. The operating method of claim 13, wherein the generating of the multi-source signals further comprises:

a power dividing operation in which a signal path is divided so as to deliver the second source signal or the third source signal to an output port.

* * * * *